(12) United States Patent
Tetelbaum (10) Patent No.: US 8,397,196 B2
(45) Date of Patent: Mar. 12, 2013

(54) INTELLIGENT DUMMY METAL FILL PROCESS FOR INTEGRATED CIRCUITS

(75) Inventor: Alexander Tetelbaum, Walnut Creek, CA (US)

(73) Assignee: LSI Corporation, Milpitas, CA (US)

(*) Notice: Subject to any disclaimer, the term of this patent is extended or adjusted under 35 U.S.C. 154(b) by 22 days.

(21) Appl. No.: 13/099,948

(22) Filed: May 3, 2011

(65) Prior Publication Data

US 2012/0284679 A1  Nov. 8, 2012

(51) Int. Cl.
*G06F 17/50*  (2006.01)

(52) U.S. Cl. ........ 716/113; 716/110; 716/111; 716/112; 716/115

(58) Field of Classification Search .................. 716/100, 716/106, 108, 110–111, 113, 115, 126–132, 716/134, 112
See application file for complete search history.

(56) References Cited

U.S. PATENT DOCUMENTS

| | | |
|---|---|---|
| 7,007,259 B2 | 2/2006 | Shrowty et al. |
| 7,107,558 B2 | 9/2006 | Tetelbaum et al. |
| 7,836,422 B1 * | 11/2010 | Huang et al. .................. 716/126 |
| 2006/0085778 A1 * | 4/2006 | Keinert et al. .................. 716/9 |
| 2010/0031220 A1 * | 2/2010 | Buehler et al. .................. 716/14 |
| 2010/0155956 A1 * | 6/2010 | Werkheiser .................. 257/773 |

OTHER PUBLICATIONS

Subramanian, J., et al. "Performance Impact from Metal Fill Insertion, session #4.2 (Physical Design CDNLive!", 2007, Freescale Semiconductor, pp. 1-12.*

* cited by examiner

*Primary Examiner* — Stacy Whitmore (57) ABSTRACT

A computer-executed method for designing dummy metal object locations in an integrated circuit design. The method comprises the steps of: a) receiving an integrated circuit design as input; b) finding areas of the integrated circuit design that do not meet a minimum metal density requirement; c) finding areas of the integrated circuit design having a critical timing path; d) blocking empty routing tracks that are adjacent to critical nets of the critical timing paths located in step (c), for prospective dummy metal object placement for the areas commonly located in both of steps (b) and (c); and e) placing a minimum number of dummy metal objects in empty tracks such that the minimum metal density requirement is met for the areas that were found in step (b), but were not blocked in step (d).

20 Claims, 4 Drawing Sheets

100 # INTELLIGENT DUMMY METAL FILL PROCESS FOR INTEGRATED CIRCUITS

TECHNICAL FIELD

The invention is directed, in general, to integrated circuit designs and, more specifically, to an electronic design automation tool and methods for optimizing the placement of dummy metal objects in an integrated circuit.

BACKGROUND

Many integrated circuit (IC) manufacturing processes require a minimum metal density for the metal interconnections on each layer of a multi-layer IC chip design. For instance, Chemical Mechanical Polishing (CMP) is often a step of the chip manufacturing process that requires a uniform distribution of metal and silicon over the surface of the chip to achieve the desire degree of planarization.

After making a detailed routing design, however, there are often areas on a chip where the minimum metal density requirement for the metal interconnects is still not met. To remedy this, the current approach is to add extra metal (dummy metal objects) as part of the metal fill procedures. Unfortunately, the current approaches, while taking into account the density requirements, do not account for the impact that dummy metal object placement has on the timing aspects of individual electrical signal networks (nets) in a circuit design.

SUMMARY

One embodiment of the disclosure is a computer-executed method for designing dummy metal object locations in an integrated circuit design. The method comprises the steps of: a) receiving an integrated circuit design as input; b) finding areas of the integrated circuit design that do not meet a minimum metal density requirement; c) finding areas of the integrated circuit design having a critical timing path; d) blocking empty routing tracks that are adjacent to critical nets of the critical timing paths located in step (c), for prospective dummy metal object placement for the areas commonly located in both of steps (b) and (c); and e) placing a minimum number of dummy metal objects in empty tracks such that the minimum metal density requirement is met for the areas that were found in step (b), but were not blocked in step (d).

Another embodiment of the disclosure is an electronic design automation tool comprising a medium for embodying a computer program for inputting to a computer; and a computer program embodied in the medium for causing the computer to perform the above-described steps.

BRIEF DESCRIPTION OF THE DRAWINGS

Reference is now made to the following descriptions taken in conjunction with the accompanying drawings, in which.

DETAILED DESCRIPTION

For the purposes of the present disclosure, the term, "or," as used herein, refers to a non-exclusive or, unless otherwise indicated.

As part of the present disclosure, it was recognized that existing electronic design automation (EDA) tools for determining the locations to place dummy metal objects can create new timing violations. A new timing violation can occur, for instance, because the dummy metal object is placed next to a timing critical net. Placing a dummy metal object adjacent to a timing critical net can increase the net's delay time due to the parasitic capacitance introduced by the dummy metal object being placed in proximity to an interconnect line (e.g., a wire) of the timing critical net.

For the purposes of the present disclosure, a timing critical net is defined as a net that belongs to a timing critical path. For the purposes of the present disclosure, all of the nets in a critical path are defined as critical nets. A path (e.g., a logic path) is considered timing critical if it has a timing slack that is less than some defined positive limit (e.g., 20 ps, 30 ps, 50 ps or 100 ps). The designation of critical path is made because any small change in the propagation delay, e.g., due to the proximity of a dummy metal object to a critical net, can change the timing slack to a negative value.

A timing violation occurs when the timing critical path does not meet the setup or hold time specifications, and the timing slack is negative for such paths.

Some examples of methods of finding critical nets in an IC design are presented in U.S. Pat. No. 7,107,558 in Tetelbaum and Al-Dabagh ("Tetelbaum"), which is incorporated herein by reference in its entirety.

The present disclosure describes embodiments of computer-executed methods, and EDA tools, which take into account specific timing critical nets, including clock nets. Embodiments of the method minimize placing dummy metal objects next to any critical net. As a result, changes in the timing of timing critical paths, due to dummy metal object placement, are minimized. In cases where is necessary to place dummy metal objects adjacent to a critical net in order to meet the minimum metal density requirements, the method takes specific timing critical nets into account to facilitate the intelligent placement and orientation of dummy metal objects in the IC design, thereby minimizing the introduction of delay times in the timing critical paths. In cases where it is necessary, to meet minimum metal density requirements, to place dummy metal objects adjacent to a critical net, and such placement would introduce a timing violation, the method tries to avoid (e.g., by locally fixing) such a violation by minimizing the impact of the placement on the timing critical paths by rerouting a wire of the critical net or, if necessary, replacing a driving cell of the critical net with a stronger (or weaker) driving cell taking into account if the critical net belongs to launch and/or data path, or capture clock path. Additionally, to minimize the effects that grounding can have on increasing delay times, the dummy metal objects placed next to critical nets are not grounded.

Figure 1:
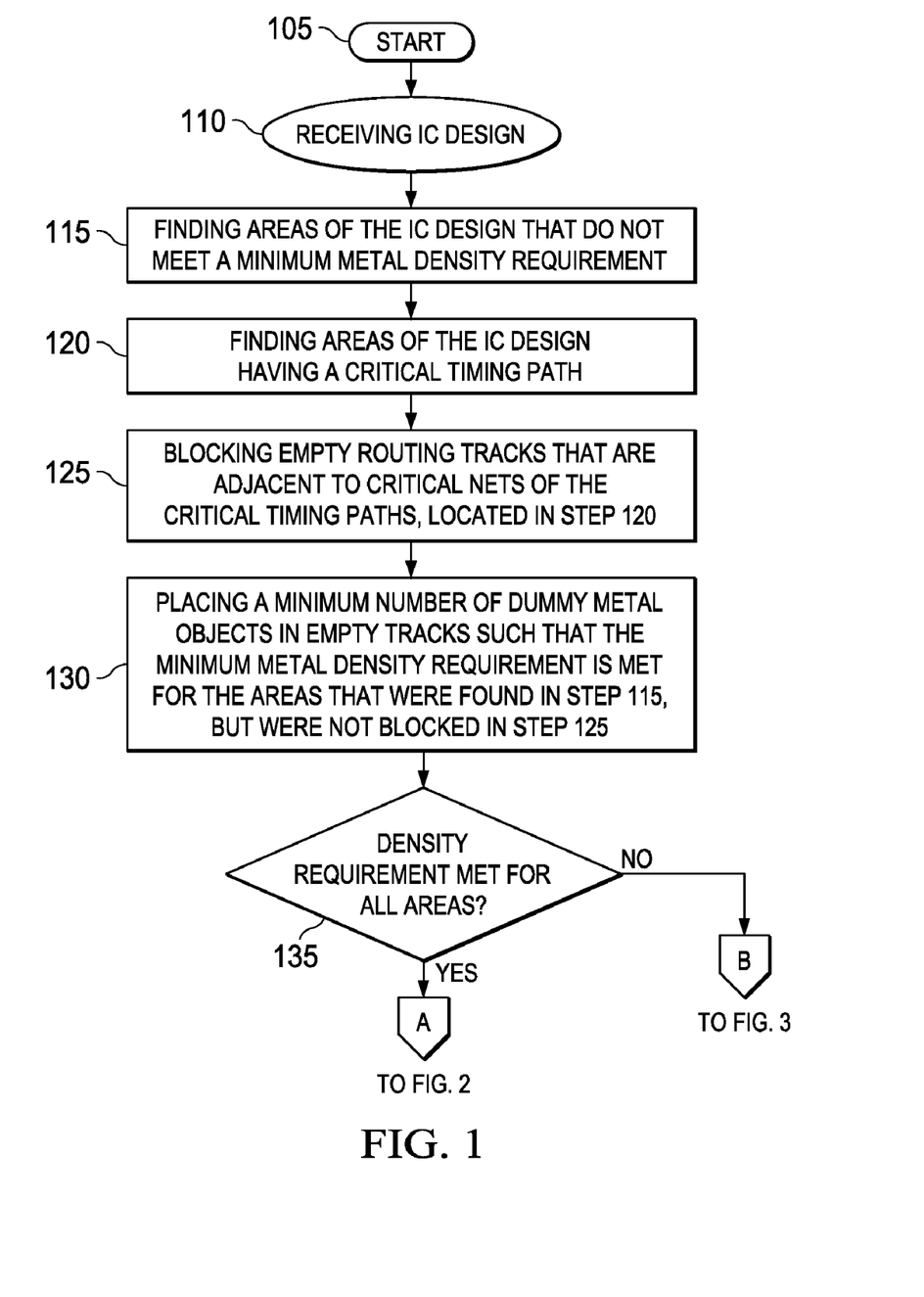
FIGS. 1-3 present a flow diagram of an example embodiment of a computer-executed method for designing dummy metal object locations in an integrated circuit design.
Figure 2:
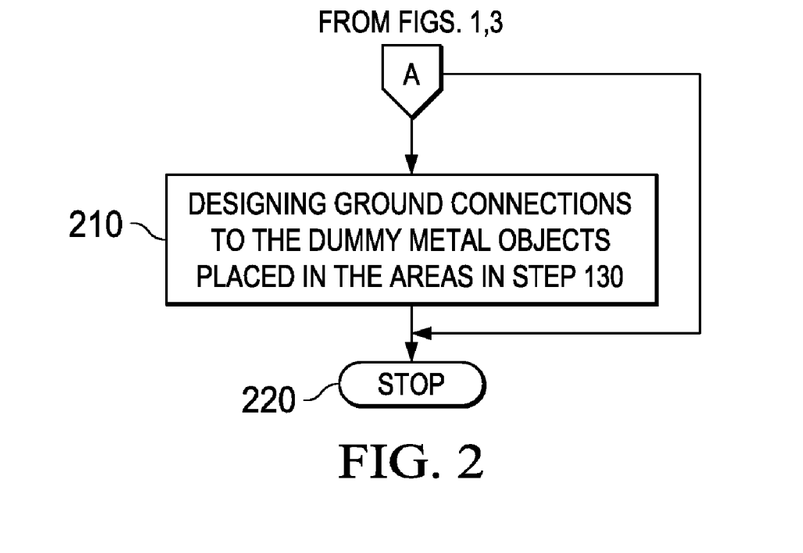
Figure 3:
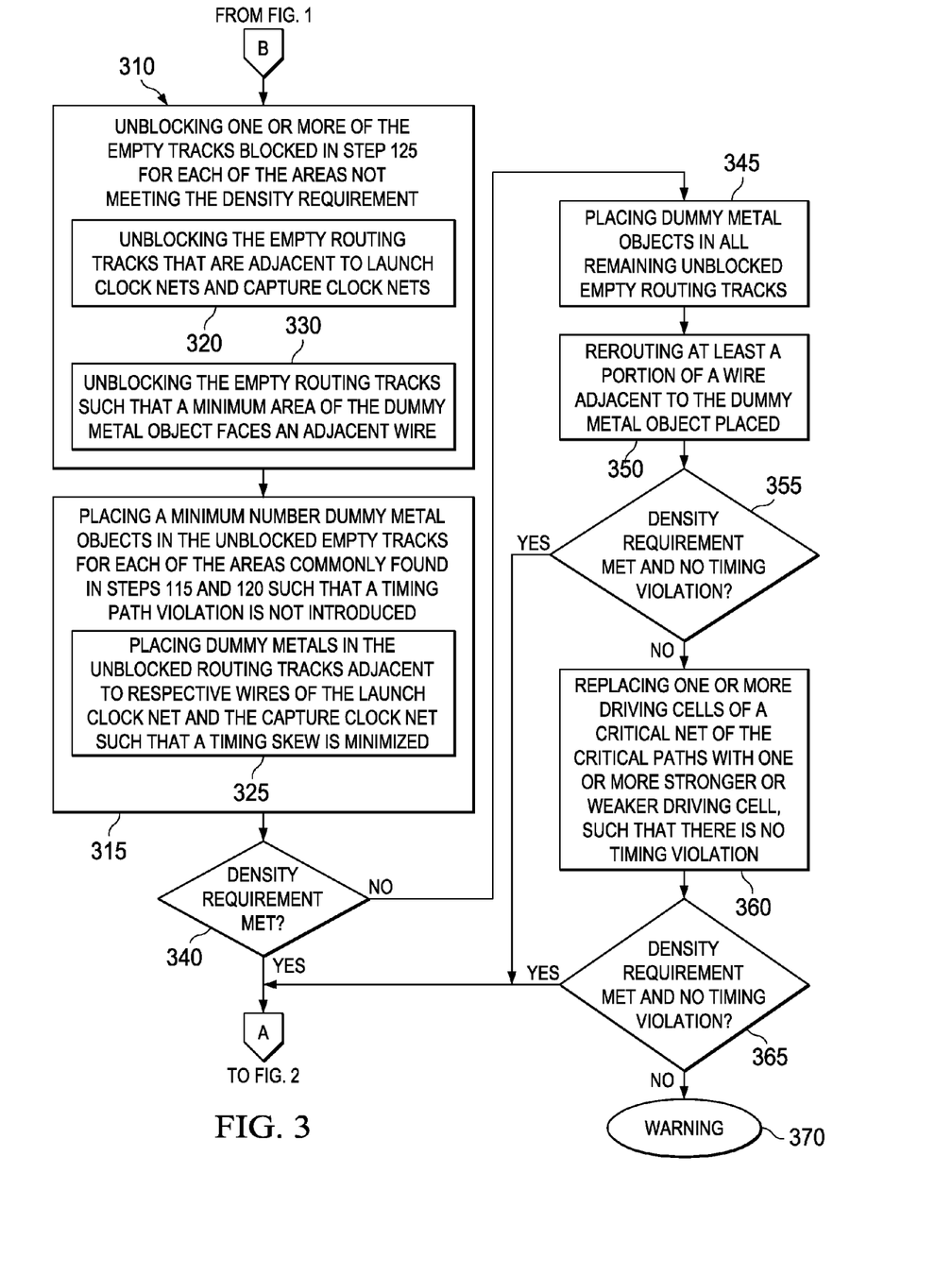

One embodiment of the present disclosure is a computer-executed method for designing dummy metal object locations in an IC design. FIGS. 1-3 present a flow diagram of an example embodiment of the computer-executed method 100 of the disclosure. In some cases, the computer-executed method 100 is embodied as a computer program.

Turning to FIG. 1, step 105 is the entry point of the method 100.

Step 110 includes receiving an IC design as input, for example, as a netlist. One of ordinary skill in the art would be familiar with methods and EDA tools to facilitate producing IC designs and converting such designs into a computer-readable format. The input in step 110 includes the identification of all interconnect routings, timing closures, and empty routing tracks, in the IC's design.

Step 115 includes find areas of the integrated circuit design that do not meet a minimum metal density requirement. IC fabrication foundries typically partition each layer of the IC design into rectangular areas, often called tiles, and specify that the interconnect density of each tile meet a minimum metal density requirement. The interconnect density for a particular tile equals the sum the areas of all interconnects in the particular tile, divided by the total area of the tile. One of ordinary skill in the art would be familiar with methods and EDA tools (e.g., such as provided by companies such as Synopsys Corp. CA, or Mentor Graphic Corp. OR) to facilitate the calculation interconnect densities and the identification of areas (e.g., tiles) that do not meet the minimum metal density requirement set by a fabrication foundry.

Step 120 includes finding areas of the integrated circuit design having a critical timing path. One of ordinary skill would be familiar with methods and EDA tools (e.g., such as described in the above-referenced Tetelbaum patent) to facilitate finding the areas (e.g., tiles) in an IC design that have critical timing paths, and their associated critical nets.

Step 125 includes blocking empty routing tracks that are adjacent to critical nets of the critical timing paths, located in step 120, for prospective dummy metal object placement, for the areas commonly found in both of steps 115 and 120 (i.e., areas where the minimum density requirement is not met and where there is a critical timing path therein). A blocked empty routing track remains unfilled with metal when the IC is fabricated. Because a dummy metal object is not placed in a blocked empty routing track, the potential for a timing delay to be introduced into the critical nets of the critical timing paths is eliminated. For example, in some embodiments of step 125, an empty routing track is considered to be adjacent to a critical net if the timing delay that would be introduced, by filling with a dummy metal object, is estimated to cause a timing violation in the critical net. In other embodiments of step 125, an empty routing track is considered to be adjacent to a critical net if the timing delay that would be introduced is estimated to within a designated safety time (e.g., 20 ps, 50 ps, 100 ps or 200 ps) of causing a timing violation in the critical net.

Step 130 includes placing a minimum number of dummy metal objects in empty tracks such that the minimum metal density requirement is met for the areas (e.g., the tiles) that were found in step 115, but were not blocked in step 125. For example, in some embodiments of step 130, a single empty routing track for a particular area is filled with a dummy metal object, and the metal density for the area is recalculated. If the minimum metal density requirement is still not met, then a second empty routing track in a particular area is filled with a second dummy metal object, and the metal density for the area is again recalculated. The step-wise addition of dummy metal objects in this fashion can be repeated iteratively until the minimum metal density requirement is met for the area.

Some embodiments of the method further include a step 135 of determining, after performing step 130, whether or not all of the areas located in step 115 meet the minimum metal density requirement.

In some cases, when all of the areas found in step 115 are determined to meet the minimum metal density requirement, then the method 100 can proceed to step 210 as shown in FIG. 2. For instance, in some IC designs, there may be no areas having a critical timing path that do not meet the minimum metal density requirement, and therefore no further dummy metal object placements need be made.

Step 210 includes designing ground connections to the dummy metal objects placed in the areas in step 130. In some embodiments of step 210, all of the dummy metal objects placed in the areas found in step 115 are routed to ground, e.g., to advantageously minimize cross-talk effects. A beneficial feature of step 210 is avoiding the grounding of any dummy metal objects that may be subsequently placed (e.g., such as described in the context of FIG. 3, below) in any of the empty routing tracks, found in step 125, that are adjacent to critical nets, e.g., to advantageously avoid increasing the delay time of the critical net. After designing the grounding connections, the method 100 can proceed to stop step 220.

As shown in FIG. 3, when step 135 determines that at least one of areas located in step 115 still does not meet the minimum metal density requirement, the method 100 further includes step 310 and step 315. Step 310 includes unblocking one or more of the empty tracks blocked in step 125 for each of the areas (e.g., the areas identified in step 135) still not meeting the minimum metal density requirement. Step 315 includes placing a minimum number of dummy metal objects in the unblocked empty tracks for each of the areas commonly found in steps 115 and 120 such that a timing path violation is not introduced.

In some embodiments of step 315, placing a minimum number dummy metal objects in the unblocked empty routing tracks can include a step-wise process of a prospectively placing a dummy metal object in one of the unblocked tracks for a particular area identified in step 135 and then determining if a timing violation would be introduced by such placement. If a timing violation is introduced, then the unblocked track is re-blocked and the dummy metal object is prospectively placed in a different unblocked track and again it is determined if a timing violation would be introduced by such placement. For example, if the design tool places the same dummy metal object in the beginning of the critical net (i.e., close to the critical net's driver), the additional capacitance will have a greater effect on net delay versus placing the same dummy object in the end of the critical net. The process can be repeated iteratively until a dummy metal can be placed in an unblocked routing track without introducing a timing violation.

If a timing violation is not introduced, then the metal density of the area is recalculated to determine whether or not the minimum metal density requirement is met. If the minimum metal density requirement is still not met, then a second dummy metal object can be prospectively placed in another one of the unblocked tracks, and then once again a determination made to assess if a timing violation is introduced by such placement. The step-wise addition of dummy metal objects in this fashion can be repeated iteratively until the minimum metal density requirement is met for the area, or, until no more dummy metal objects can be added without introducing a timing violation.

One of ordinary skill in the art would understand that timing critical paths (e.g., a logic path) have related branches of launch clock and capture branch nets. The launch clock net branch goes to a launch flip-flip of the logic path (also called data path) and a capture clock net branch goes to a capture flip-flop of the logic path. Both launch clock and capture clock nets are critical nets in the critical timing path. Timing skew refers to the difference between the capture and launch clock path delay times (e.g., the sum of the cell and net delays along the path being considered).

Some preferred embodiments of step 310 further includes a step 320 of unblocking the empty routing tracks that are adjacent to launch clock nets and capture clock nets of the critical timing path. Some preferred embodiments of step 315 further includes a step 325 of placing dummy metals in the unblocked routing tracks adjacent to respective wires of the launch clock net and the capture clock net such that any change in the timing skew between the launch clock net and the capture clock net is minimized. For example, if equal amounts of dummy metal are added to both launch and capture clock nets, then the additional delays will cancel each other out in the skew.

In some embodiments, for example, the dummy metals placed adjacent to the respective wires of the launch net and the capture net (in step 325), are placed in the unblocked tracks that are symmetrically located with respect to the respective wires of the launch clock net and the capture clock net. Symmetrically locating the pairs of dummy metal objects in proximity to wires of both of the capture and launch clock net advantageously introduces about the same change in the delay times (e.g., within about 10 percent) in the capture and launch clock nets, thereby avoiding the introduction of additional timing skew.

Some preferred embodiments of step 310 include a step 330 of the unblocking of the empty routing tracks to allow the placement of the dummy metals objects in the unblocked tracks (in step 315) such that a minimum area of the dummy metal object faces an adjacent wire of a critical net of the critical timing path. Minimizing the area of the dummy metal object that faces the adjacent wire also minimizes the capacitive coupling between the wire and the dummy metal object, thereby minimizing the delay time added to the critical net. Minimizing the delay time may be advantageous in cases, e.g., where the dummy metal object is placed next to a wire in a logic path nets or a launch clock net of a critical path that is at risk of a setup timing violation. At the same time, placing larger dummy metal object into the capture clock net will improve setup slack. This follows because the dummy metal objects placed so as to minimizing the delay time may mitigate causing a signal coming from a data path more slowly than desired and thereby causing a timing violation. Thus, it is important to know if the critical path is critical to a setup violation or to a hold violation. If the critical path is a setup critical path, then the design tool can preferably minimize any increase in delay in launch clock path or logic path, and, increase delay in capture clock path. If the critical path is a hold critical path, then the design tool can preferably can minimize any increase in delay in capture clock path, and, increase delay in one or both of the logic path or capture clock path.

Figure 4:
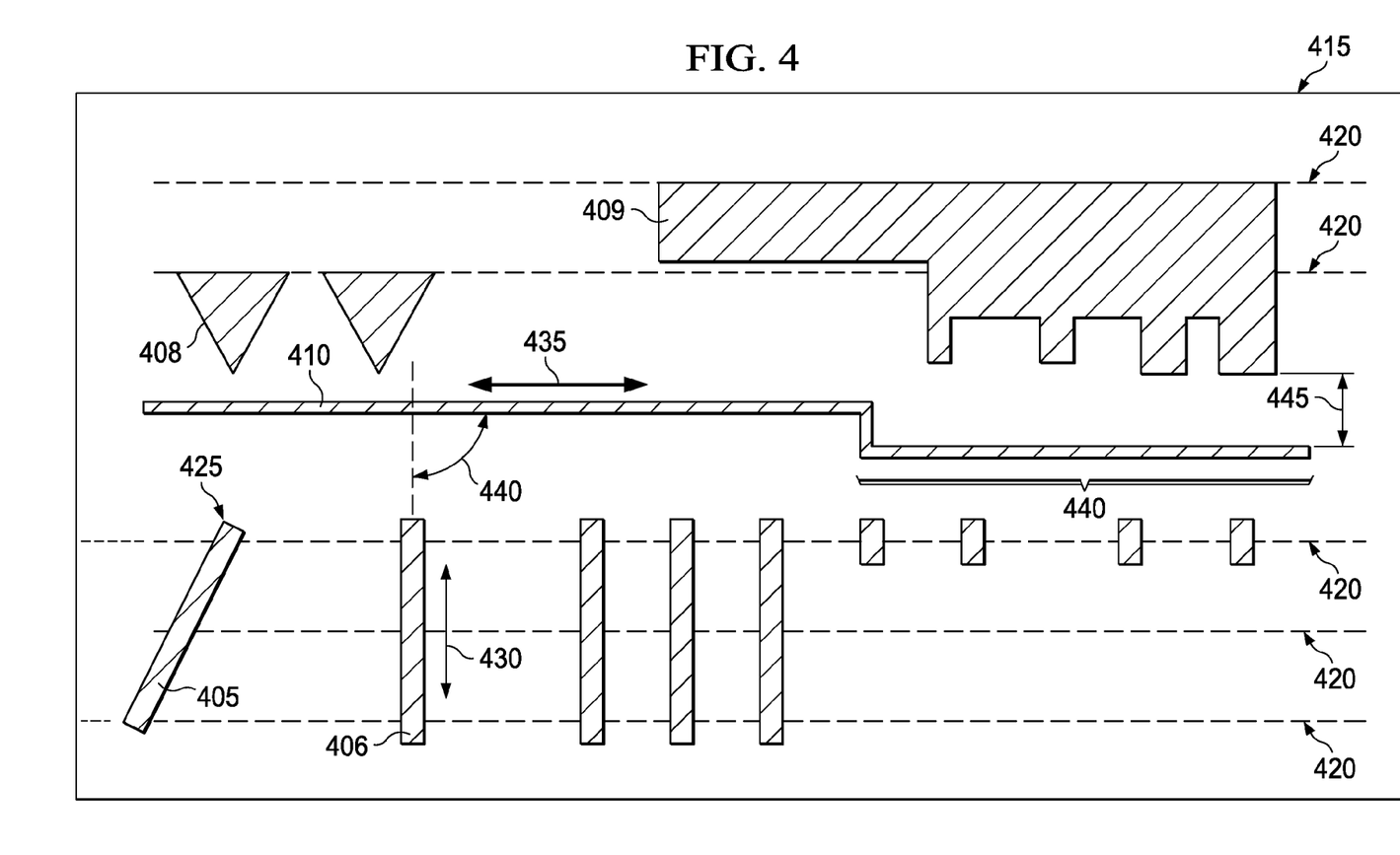
FIG. 4 presents an example placements of a dummy metal objects adjacent to a wire of a critical net, in accordance to an example embodiments of the computer-executed method discussed in the context of FIGS. 1-3.

FIG. 4 presents examples of dummy metal objects 405, 406, 407, 408, 409 placed (step 315) adjacent to a wire 410 of a critical net, in accordance to embodiments where the empty routing tracks 420 were unblocked in an area 415 (only a portion of which is depicted in the figure) commonly found in steps 115 and 120, in accordance with step 330. As illustrated, in some cases, placing a dummy metal object 405 in one or more an empty routing tracks, unblocked in accordance to step 330, results in at least one (and in some cases, all) of the dummy metal objects 405 to be oriented such that a corner 425 of the dummy metal object 405 faces the wire 410. As also illustrated, in some cases, placing a dummy metals object 406 in an empty routing track 420 unblocked in accordance to step 330, results in at least one (and in some cases, all) of the dummy metal objects 405 to be oriented such that a long axis 430 of the dummy metal object 406 is substantially non-parallel to a long axis 435 of the wire 410. For the purposes of the present disclosure, the long axis 430 of the dummy metal object 406 is non-parallel to the long axis 435 of the wire 410 if imaginary lines extended along the two long axes 430, 435 form an angle 440 of intersection that is greater than about 1 degree, and more preferably, greater than about 10 degree and even more preferably, about 90 degree (e.g., the long axes 430, 435 are substantially perpendicular).

Although some of dummy metal objects 405, 406 depicted in FIG. 4 have rectangular shapes, the dummy metal objects of the disclosure could have any regular or irregular geometric shape (e.g., triangular-shaped objects 408, or irregular-shaped objects 409), to facilitate the goal of minimizing the capacitive coupling between the wire and the dummy metal object while at the same time meeting the minimum density requirement. Similarly, the dummy metal objects can be placed in a regular pattern or in a random or pseudo-random pattern, if desired.

Although in some embodiments it can be advantageous to orient certain dummy metal objects to minimize the capacitive coupling, the method 100 does not preclude dummy metal object orientations that do not minimize the delay time. For instance, in some cases, it may be advantageous to increase a delay time, e.g., by using a dummy metal orientation where the long axis 430 of the dummy metal object 406 is substantially parallel to the long axis 435 of the wire 410 (e.g., the angle 440 of intersection is less than about 1 degree and more preferably, about 0 degrees). Increasing the delay time may be advantageous in cases, e.g., where the dummy metal object is placed next to a wire in a capture clock net of a critical path that is at risk of a setup timing violation. This advantage follows because the dummy metal objects placement may increase the delay time in capture clock sufficiently to mitigate a signal coming from a data path more slowly than desired and thereby causing a setup timing violation.

Returning to FIG. 3, some embodiments of the method 100 include a step 340 of determining, after performing step 315, whether or not all of the areas found in step 115 meet the minimum metal density requirement.

In cases where step 340 determines that all of the areas found in step 115 meet the minimum metal density requirement, then the method 100 can proceed to step 210 (FIG. 2) and then to stop step 220, or, directly to stop step 220.

In cases where at least one of the areas found in step 115 still does not meet the minimum metal density requirement, then the method 100 proceeds to steps 345-355.

Step 345 includes placing dummy metal objects in all remaining unblocked empty routing tracks for each of the areas determined in step 340 that still not meet the minimum density requirement. That is, the areas where dummy metal objects are placed, in accordance with step 345, includes only those areas commonly found in steps 115 and 120 and that are not already filled in accordance with step 315 to meet the minimum density requirement. The placement of the dummy metal objects in step 345 can include any of the intelligent placement steps discussed above in the context of steps 320-330, e.g., to minimize timing skew or timing slack, or both, and minimize the introduced delay time by minimizing the capacitive coupling with the adjacent wire.

Step 350 includes determining if there are merits in rerouting at least a portion of a wire adjacent to the dummy metal object, placed in step 345, such that a distance separating the wire and the adjacent dummy metal object is increased, thereby minimizing or eliminating timing violations in each of the critical timing paths located in the least one areas (i.e., the areas identified in step 340).

For instance, as further illustrated in FIG. 4, a portion 440 of the wire 410 can be designed to be re-routed in accordance with step 350 such that a distance 445 separating the wire 410 and the adjacent dummy metal object 409 is increased, compared to the case where the wire 410 was not re-rerouted (e.g., the wire follows a straight route). The prospective rerouting of the wire 410 or portion 440 of the wire 410 is done in a manner that does not violate design rules of the integrated circuit design input received in step 110. If, however, rerouting would violate the design rules of the integrated circuit design for any of the areas where a dummy metal object was placed in step 345, then step 350 is not performed for the area 415.

Some embodiments of the method 100 include a step 355 of determining, after performing step 350, whether or not there is no timing violation for any of the critical paths in the areas determined in step 340, and, whether or not the minimum density requirement is met.

In cases where all of the areas are determined in step 355 to meet the minimum metal density requirement, and the wire rerouting step 350 eliminates any timing violations introduced by step 345, then the method 100 can proceed to step 210 (FIG. 2) and then on to stop step 220, or, directly to stop step 220.

In the case where at least one of the areas determined in step 355 still has a timing violation (e.g., after wire rerouting in step 350, or, if rerouting was not possible), or the density requirement is still not met, then the method proceeds to step 360.

Step 360 includes replacing one or more driving cells of a critical net of the critical paths with a stronger or weaker driving cell (e.g., one or more stronger or weaker cells) such that there is no timing violation for all of the critical paths determined in step 355 to have a timing violation. Stronger cells have less delay and can be advantageously used in a launch clock path and a logic path, e.g., to avoid setup violations, or, can be used in a capture clock path to, e.g., avoid hold violations. Weaker cells have more delay and can be advantageously used in a launch clock path and a logic path to, e.g., avoid hold violations, or, can be used in a capture clock path to, e.g., avoid setup violations. One of ordinary skill in the art would be familiar with available libraries of drive cells that have the same functionality (and preferably the same footprint) but that operate faster, usually at the expense of increased power consumption, or slower, often with the benefit of decreased power consumption. Because the stronger drive cell operates faster, the delay time is shortened thereby potentially eliminating the timing violation if used properly (i.e., by taking into account the particular type of violation and type of path) as described above. Because the weaker drive cell operates slower, the delay time is increased thereby potentially eliminating the timing violation, if used properly (i.e., by taking into account the particular type of violation and type of path) as described above.

Some embodiments of the method 100 include a step 365 of determining, after performing step 360, whether or not there is a timing violation for any of the critical paths in the areas determined in step 340 and whether or not the minimum density requirement is met.

If after performing step 360, all of the areas identified in step 355 have no timing violations and meet the minimum density requirement, then the method can proceed to step 210 (FIG. 2) and then to stop step 220, or, directly to stop step 220.

If after performing step 360, it is determined in step 365 that either it was not possible to eliminate the timing violation or meet the minimum density requirement, or both, then the method 100 issues, in step 370, a warning indication of which areas still have timing violations, do not meet the minimum density requirement, or, both.

Another embodiment of the present disclosure is an electronic design automation (EDA) tool. One of ordinary skill in the art would be familiar with EDA tools, a category of computer aided design (CAD) tools, often used by electronic circuit designers to design ICs. The EDA tool of the disclosure can be a stand-alone tool or could be incorporated into EDA tools having a broader design purpose.

Figure 5:
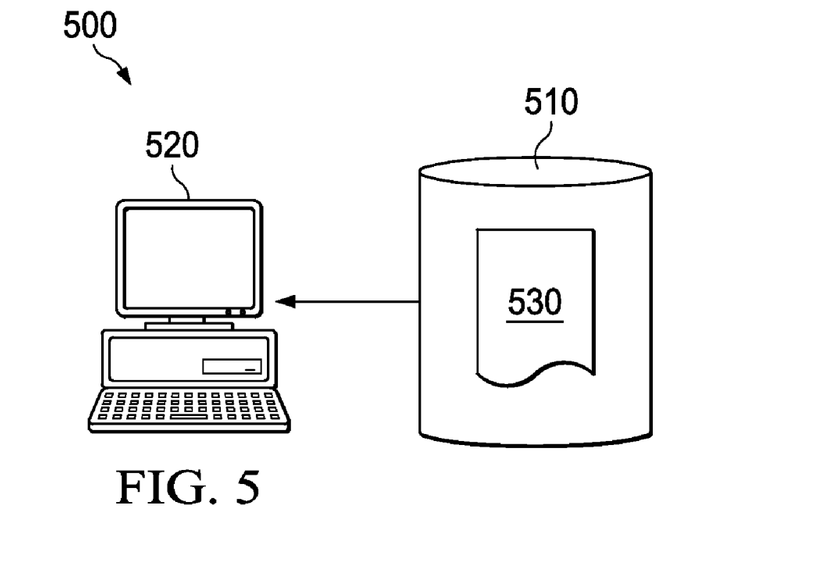
FIG. 5 presents a block diagram of an example electronic design automation tool of the disclosure, such as electronic design automation tool configured to perform the method described in the context of FIGS. 1-3.

FIG. 5 presents a block diagram of an example electronic design automation tool 500 of the disclosure, such as an electronic design automation tool configured to perform the method 100 described in the context of FIGS. 1-3.

As illustrated in FIG. 5 the tool 500 comprises a medium 510 (e.g., a computer disk) for embodying a computer program for inputting to a computer 520. The tool 500 also comprises a computer program 530 embodied in the medium 510 for causing the computer 520 to perform the steps of the computer-executed method 100 discussed above in the context of FIGS. 1-4. For instance, in certain embodiments of the tool 500, the computer program 530 causes the computer 520 to perform steps 110-135 as discussed in the context of FIG. 1. In some embodiments of the tool 500 the computer program 530 causes the computer 520 to perform one or more of steps 210-220 or steps 310-366, discussed in the context of FIGS. 2-3.

Those skilled in the art to which this application relates will appreciate that other and further additions, deletions, substitutions and modifications may be made to the described embodiments.

What is claimed is:

1. A computer-executed method for designing dummy metal object locations in an integrated circuit design, comprising the steps of:
    a) receiving at a computer an integrated circuit design as input;
    b) finding at the computer areas of the integrated circuit design that do not meet a minimum metal density requirement;
    c) finding at the computer areas of the integrated circuit design having a critical timing path;
    d) blocking at the computer empty routing tracks that are adjacent to critical nets of the critical timing paths located in step (c), for prospective dummy metal object placement for the areas commonly located in both of steps (b) and (c); and
    e) placing at the computer a minimum number of dummy metal objects in empty tracks such that the minimum metal density requirement is met for the areas that were found in step (b), but were not blocked in step (d).

2. The method of claim 1, further including the step of:
    f) determining, after performing step (e), whether or not all of the areas located in step (b) meet the minimum metal density requirement.

3. The method of claim 2, wherein, when step (f) determines that at least one of areas located in step (b) still does not meet the minimum metal density requirement, further including the steps of:
    g) unblocking one or more of the empty routing tracks blocked in step (d) for each of the areas still not meeting the minimum metal density requirement; and
    h) placing a minimum number dummy metal objects in the unblocked empty routing tracks for each of the areas commonly located in steps (b) and (c) such that a timing path violation is not introduced into one of the critical timing paths.

4. The method of claim 3, wherein:
step (g) further includes unblocking the empty routing tracks that are adjacent to launch and capture clock nets of the critical timing path; and
step (h) includes placing dummy metals in the unblocked routing tracks adjacent to respective wires of the launch clock net and the capture clock net such that a change in timing skew between the launch clock net and the capture clock net is minimized.

5. The method of claim 4, wherein the dummy metals placed adjacent to the respective wires of the launch net and the capture net in step (h) are placed in the unblocked routing tracks that are symmetrically located with respect to the respective wires of the launch clock net and the capture clock net.

6. The method of claim 3, wherein the unblocking of the empty routing tracks in step (g) allows placing the dummy metals objects in the unblocked tracks in step (h) such that a minimum area of the dummy metal object faces an adjacent wire of a critical net of the critical timing path.

7. The method of claim 6, wherein placing the dummy metals objects in step (h) results in at least one of the dummy metal objects to be oriented such that a corner of the dummy metal object faces the wire.

8. The method of claim 6, wherein placing the dummy metals objects in step (h) results in at least one of the dummy metal objects to be an oriented such that a long axis of the dummy metal object is substantially non-parallel to a long axis of the wire.

9. The method of claim 4, further including the step of:
i) determining, after performing step (h), whether or not all of the areas found in step (b) meet the minimum metal density requirement.

10. The method of claim 9, wherein, when step (i) determines that at least one of the areas found in step (b) still does not meet the minimum metal density requirement, further including the steps of:
j) placing dummy metal objects in all remaining unblocked empty routing tracks for each of the areas determined in step (i) to still not meet the minimum density requirement; and
k) determining if a rerouting at least a portion of a wire adjacent to the dummy metal object placed in step (j) can be made such that a distance separating the wire and the adjacent dummy metal object is increased, thereby minimizing or eliminating timing violations in each of the critical timing paths located in each of the areas determined in step (i) to still not meet the minimum density requirement.

11. The method of claim 10, further including:
1) determining, after performing step (k), whether or not there is a timing violation for any of the critical paths, and whether or not the minimum metal density requirement is met, for the areas identified in step (i); and
m) replacing one or more driving cells of a critical net of the critical paths with one or more stronger or weaker driving cell, such that there is no timing violation for all of the critical paths determined in step (1) to have a timing violation.

12. The method of claim 2, further including the step of:
n) designing ground connections to the dummy metal objects placed in the areas in step (e).

13. An electronic design automation tool, comprising:
a non-transitory computer readable medium for embodying a computer program for inputting to a computer; and
a computer program embodied in the computer readable medium for causing the computer to perform steps of:
a) receiving an integrated circuit design as input;
b) finding areas of the integrated circuit design that do not meet a minimum metal density requirement;
c) finding areas of the integrated circuit design having a critical timing path;
d) blocking empty routing tracks that are adjacent to critical nets of the critical timing paths located in step (c), for prospective dummy metal object placement for the areas commonly located in both of steps (b) and (c); and
e) placing a minimum number of dummy metal objects in empty tracks such that the minimum metal density requirement is met for the areas that were found in step (b), but were not blocked in step (d).

14. The tool of claim 13, wherein the computer program further causes the computer to perform the step of:
f) determining, after performing step (e), whether or not all of the areas located in step (b) meet the minimum metal density requirement.

15. The tool of claim 14, wherein, when step (f) determines that at least one of areas located in step (b) still does not meet the minimum metal density requirement, the computer program further causes the computer to perform the steps of:
g) unblocking one or more of the empty routing tracks blocked in step (d) for each of the areas still not meeting the minimum metal density requirement; and
h) placing a minimum number dummy metal objects in the unblocked empty routing tracks for each of the areas commonly located in steps (b) and (c) such that a timing path violation is not introduced into one of the critical timing paths.

16. The tool of claim 14, wherein:
step (g) further includes unblocking the empty routing tracks that are adjacent to launch and capture clock nets of the critical timing path; and
step (h) includes placing dummy metals in the unblocked routing tracks adjacent to respective wires of the launch clock net and the capture clock net such that a change in the timing skew between the launch clock net and the capture clock net is minimized.

17. The tool of claim 14, wherein the computer program further causes the computer to perform the step of:
i) determining, after performing step (h), whether or not all of the areas found in step (b) meet the minimum metal density requirement.

18. The tool of claim 17, wherein, when step (i) determines that at least one of the areas found in step (b) still does not meet the minimum metal density requirement, the computer program further causes the computer to perform the step of:
j) placing dummy metal objects in all remaining unblocked empty routing tracks for each of the areas determined in step (i) to still not meet the minimum density requirement; and
k) determining if a rerouting at least a portion of a wire adjacent to the dummy metal object placed in step (j) can be made such that a distance separating the wire and the adjacent dummy metal object is increased, thereby minimizing or eliminating timing violations in each of the critical timing paths located in each of the areas determined in step (i) to still not meet the minimum density requirement.

19. The tool of claim 18, wherein the computer program further causes the computer to perform the steps of:
1) determining, after performing step (k), whether or not there is a timing violation for any of the critical paths, and whether or not the minimum metal density requirement is met, for the areas identified in step (i); and
m) replacing one or more driving cells of a critical net of the critical paths with one or more stronger or weaker driving cell, such that there is no timing violation for all of the critical paths determined in step (1) to have a timing violation.

20. The tool of claim 14, wherein the computer program further causes the computer to perform the step of:
n) designing ground connections to the dummy metal objects placed in the areas in step (e).

\* \* \* \* \*